(12) United States Patent
Carter et al.

(10) Patent No.: US 8,384,165 B2
(45) Date of Patent: Feb. 26, 2013

(54) APPLICATION OF GATE EDGE LINER TO MAINTAIN GATE LENGTH CD IN A REPLACEMENT GATE TRANSISTOR FLOW

(75) Inventors: Richard J. Carter, Fairview, OR (US);
Wai Lo, Lake Oswego, OR (US);
Sey-Shing Sun, Portland, OR (US);
Hong Lin, Vancouver, WA (US); Verne Hornback, Camas, WA (US)

(73) Assignee: LSI Corporation, San Jose, CA (US)

( * ) Notice: Subject to any disclaimer, the term of this patent is extended or adjusted under 35 U.S.C. 154(b) by 380 days.

(21) Appl. No.: 12/140,773

(22) Filed: Jun. 17, 2008

(65) Prior Publication Data

US 2008/0308882 A1 Dec. 18, 2008

Related U.S. Application Data

(63) Continuation of application No. 10/916,322, filed on Aug. 11, 2004, now Pat. No. 7,405,116.

(51) Int. Cl.
*H01L 29/49* (2006.01)
*H01L 29/51* (2006.01)

(52) U.S. Cl. ............... 257/407; 257/410; 257/E21.626; 257/E21.64

(58) Field of Classification Search .......... 257/E21.626, 257/E21.64, 407, 410; 438/303, FOR. 199
See application file for complete search history.

(56) References Cited

U.S. PATENT DOCUMENTS

| 6,518,113 | B1 * | 2/2003 | Buynoski | 438/217 |
|---|---|---|---|---|
| 6,908,822 | B2 * | 6/2005 | Rendon et al. | 438/303 |
| 7,405,116 | B2 * | 7/2008 | Carter et al. | 438/183 |
| 7,439,113 | B2 * | 10/2008 | Doczy et al. | 438/157 |
| 7,449,378 | B2 * | 11/2008 | Chidambarrao et al. | 438/197 |
| 7,544,996 | B2 * | 6/2009 | Ku et al. | 257/336 |
| 2007/0037372 | A1 * | 2/2007 | Kavalieros et al. | 438/585 |
| 2008/0185637 | A1 * | 8/2008 | Nagaoka et al. | 257/327 |
| 2008/0210990 | A1 * | 9/2008 | Lim | 257/292 |
| 2009/0039426 | A1 * | 2/2009 | Cartier et al. | 257/344 |
| 2009/0101956 | A1 * | 4/2009 | Booth et al. | 257/301 |
| 2009/0108350 | A1 * | 4/2009 | Cai et al. | 257/347 |
| 2009/0242999 | A1 * | 10/2009 | Koehler et al. | 257/410 |
| 2009/0289306 | A1 * | 11/2009 | Watanabe et al. | 257/369 |
| 2009/0302388 | A1 * | 12/2009 | Cai et al. | 257/351 |
| 2009/0311836 | A1 * | 12/2009 | Cartier et al. | 438/163 |

* cited by examiner

*Primary Examiner* — George Fourson, III
(74) *Attorney, Agent, or Firm* — Clark Hill PLC

(57) ABSTRACT

A method to maintain a well-defined gate stack profile, deposit or grow a uniform gate dielectric, and maintain gate length CD control by means of an inert insulating liner deposited after dummy gate etch and before the spacer process. The liner material is selective to wet chemicals used to remove the dummy gate oxide thereby preventing undercut in the spacer region. The method is aimed at making the metal gate electrode technology a feasible technology with maximum compatibility with the existing fabrication environment for multiple generations of CMOS transistors, including those belonging to the 65 nm, 45 nm and 25 nm technology nodes, that are being used in analog, digital or mixed signal integrated circuit for various applications such as communication, entertainment, education and security products.

16 Claims, 3 Drawing Sheets

APPLICATION OF GATE EDGE LINER TO MAINTAIN GATE LENGTH CD IN A REPLACEMENT GATE TRANSISTOR FLOW

RELATED APPLICATION (PRIORITY CLAIM)

This patent application is a continuation of U.S. patent application Ser. No. 10/916,322, filed on Aug. 11, 2004 now U.S. Pat. No. 7,405,116, which is incorporated herein by reference in its entirety.

BACKGROUND

The present invention generally relates to the formation of transistor gates, and more specifically relates to the application of a gate edge liner to maintain gate length critical dimension ("CD") in a gate transistor flow.

The aggressive scaling of MOS devices is quickly reaching the fundamental limits of $SiO_2$ as the gate dielectric. Scaling requirements can no longer be achieved with $SiO_2$ or nitrided-$SiO_2$ as the gate dielectric due to direct tunneling resulting in excessive leakage current and a lack of manufacturability of sub-1 nm oxides. Moreover, poly-Si depletion and threshold voltage shifts due to boron penetration into the channel region severely degrade device performance. Replacement of $SiO_2$-based gate dielectrics with a high dielectric constant (high-k) material provides a means to address scaling issues. A high-k material allows for a physically thicker film to meet the required gate capacitance, while reducing the leakage current due to direct tunneling and improving manufacturability.

It has been shown that high-k materials are susceptible to boron penetration just as $SiO_2$. In order to prevent boron penetration into the channel, capping layers or nitridation of the high-k material have been employed. However, this is done at the price of increasing the equivalent oxide thickness (EOT), i.e. decrease in the gate capacitance. The issue of poly-Si depletion is still not overcome when using a high-k material, since the 3-6 Å contribution to EOT due to poly-Si depletion is still about 30-50% of the target EOT. As a result, the semiconductor industry began investigating metal gate electrodes. Replacement of poly-Si with a metal electrode solves both the boron penetration and poly-Si depletion issues. Moreover, the introduction of metal gates can prolong the use of $SiO_2$ for one or two technology generations for high performance applications before the needed switch to high-k dielectrics.

A major challenge to the introduction of metal electrodes is addressing the issue of how to integrate these materials into conventional transistor processing. In the case of CMOS and partially depleted SOI, two metal types will be needed—one with an n-type work function, and one with a p-type work function. In the case of fully depleted SOI, a single metal with a mid-gap work function can be used. Whether one type or two types of metals are used, the integration question is still open. Many candidate metals will not sustain a standard source/drain activation anneal due to either reaction with the gate dielectric or the low melting temperature of many metal materials. In order to increase the number of candidate metal materials, a replacement gate approach is very appealing.

The replacement gate approach uses a dummy gate stack to define the source/drain area, thereby maintaining a self-aligned process as achieved with an etched gate approach. There are variations of this scheme, but the essential steps are as follows: sacrificial $SiO_2$ growth and poly-Si deposition (transistor can have STI); Poly-Si patterning, resist ashing and stripping (removes sacrificial $SiO_2$ outside the gate areas); LDD masking, implanting, resist ashing and stripping; spacer LTO and SiN deposition, etching; SD implanting annealing; ILD deposition, CMP (chemical mechanical polishing); wet etching of Poly-Si and the sacrificial $SiO_2$ underneath (also removes part of the LTO under the SiN spacer); gate oxide growth (e.g., thermal oxidation, plasma oxidation, high K deposition); metal fill; CMP (chemical mechanical polishing); and ILD and contact fabrication.

So, after source/drain implants, spacer definition and CMP (or etchback) of the inter-layer dielectric (ILD), the dummy gate stack is removed and replaced with the $SiO_2$/metal gate or high-k/metal gate structure. A major challenge for the replacement gate process is to remove the dummy gate stack, typically consisting of poly-Si/$SiO_2$. Removal of the dummy electrode can be achieved via dry or wet etching. Dry etching of the dummy gate dielectric is not a viable option due to damage to the channel region, resulting in severe degradation to the device. Therefore, a wet etch process is needed to remove the dummy gate dielectric. The need for a wet etch process to remove the dummy gate dielectric is the major problem of existing replacement gate schemes. The isotropic nature of a wet etching process leads to under-cut of the LTO underneath the nitride spacer. This leads to the following disadvantages:

a) Lack of gate length control: undercutting of LTO under the SiN spacer changes the original gate length CD defined by the dummy gate.
b) Lack of gate dielectric thickness uniformity: the undercutting also results in the non-uniformity of the high-K dielectric in the final transistor. This non-uniformity affects the electric field distributions in the dielectric as well as in the channel, causing degradation in channel mobility and dielectric reliability.

OBJECTS AND SUMMARY

An object of an embodiment of the present invention is to provide a gate transistor flow which allows control of the gate length and provides a uniform gate dielectric thickness.

Another object of an embodiment of the present invention is to provide a gate transistor flow which provides that critical gate lengths are better defined and controlled from device to device, which results in improved process robustness.

Still another object of an embodiment of the present invention is to provide a gate transistor flow which prevents spacer undercut during dummy gate stack removal.

Yet another object of an embodiment of the present invention is to provide a gate transistor flow which provides a well-defined gate stack edge.

Still yet another object of an embodiment of the present invention is to provide a gate transistor flow which provides that chemical reactions between a liner and metal gate electrodes are minimized, which subsequently results in better control of gate properties.

An embodiment of the present invention provides a novel method to maintain a well-defined gate stack profile, deposit or grow a uniform gate dielectric, and maintain gate length CD control by means of an inert insulating liner deposited after dummy gate etch and before the spacer process. The liner material is selective to wet chemicals used to remove the dummy gate dielectric thereby preventing undercut in the spacer region The present invention aims at making the metal gate electrode technology a feasible technology with maximum compatibility with the existing fabrication environment for multiple generations of CMOS transistors, including those belonging to the 65 nm, 45 nm and 25 nm technology nodes, that are being used in analog, digital or mixed signal integrated circuit for various applications such as communication, entertainment, education and security products.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
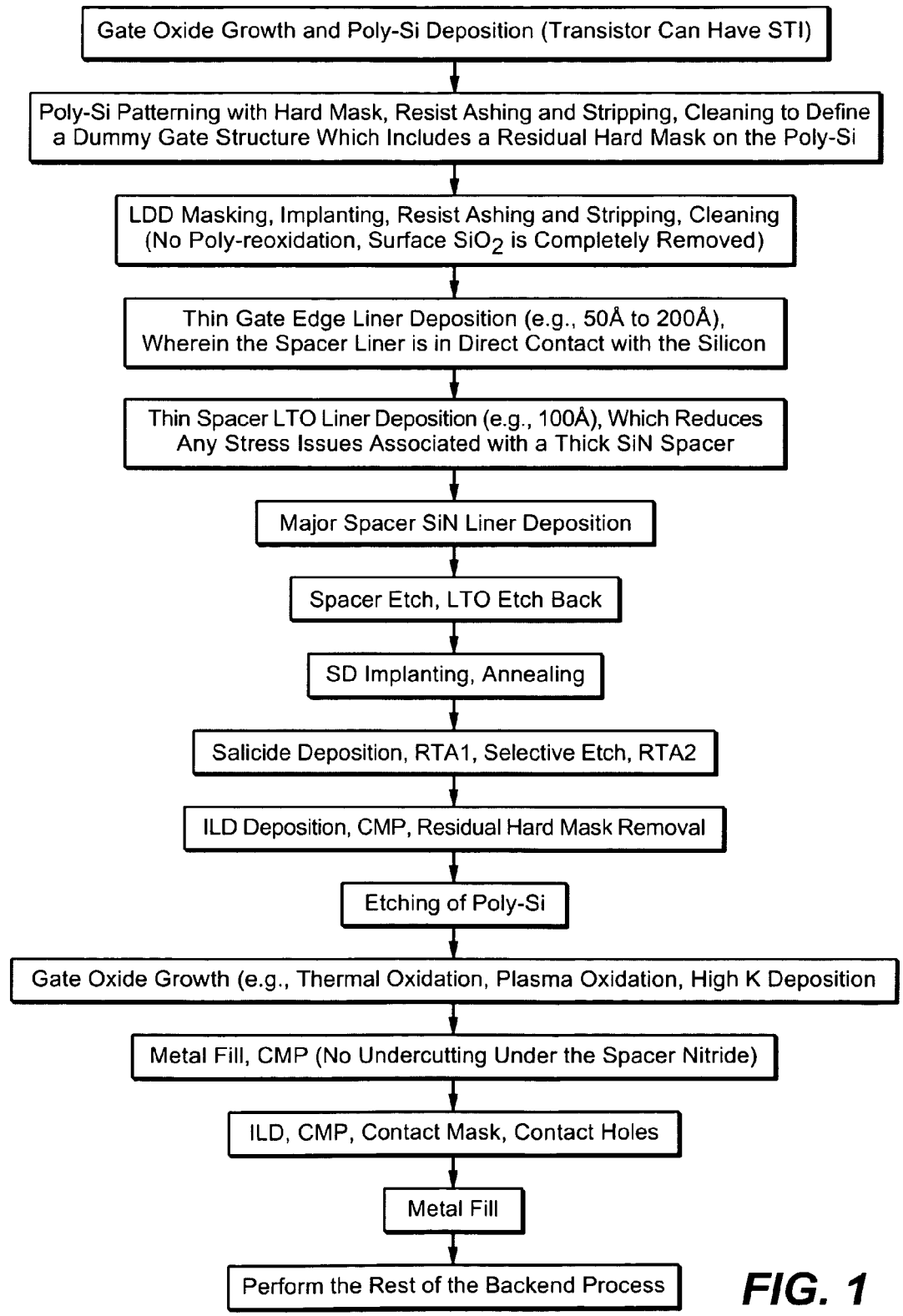
FIG. 1 is a flow chart which illustrates a method which is in accordance with an embodiment of the present invention.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

This invention aims to provide a way to maintain critical gate lengths and profile and improve gate dielectric uniformity by using a gate edge liner material. The presence of the liner material is to prevent undercut in the spacer region during dummy gate stack removal that currently plagues conventional replacement gate process flows as previously described. In order for the liner process to work as needed, the liner material of choice must meet the following requirements:

1) Insulating material.
2) Inert with respect to wet chemical processing
3) Rigid, high mechanical strength.
4) Good adhesion properties.
5) Selectivity to dummy gate removal process.
6) Thermally stable with dummy gate.

Hafnia-containing materials (e.g., $HfO_2$, HfON, HfSiON) are being widely investigated as the replacement gate dielectric material for $SiO_2$, with a target introduction into manufacturing in 2005 (See:2001 ITRS roadmap, June $10^{th}$ press release on Toshiba website, as well as 2003 IEDM and 2003 VLSI symposium proceedings). During the investigation of Hafnia-containing materials for the gate dielectric application, it has been found that these materials are extremely resistant to wet chemical etch chemistries, have a high mechanical strength and rigidness, and are stable in contact with Si above 1000° C. A new application for Hafnia-containing materials would be as the proposed gate edge liner. Current deposition techniques for these materials, such as MOCVD and ALD, result in excellent step coverage and uniformity, which are critical to deposit a thin, well-controlled gate edge liner material.

The material of choice for the gate liner is not limited to Hafnia-containing ceramic materials. There are few families of materials that can meet the required properties for a robust gate edge liner.

A snapshot of candidate materials families include:
a) Carbides (e.g. SiC, diamond-like C).
b) Nitrides (e.g. AlN).
c) High permittivity ceramics (e.g. $c-ZrO_2$, $c-Al_2O_3$, BST, STO, STZ).

Figure 2:
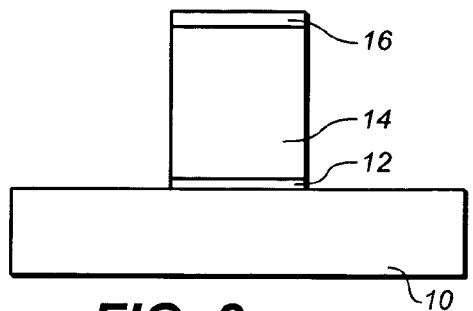
FIGS. 2-9 provide views which relate to the method illustrated in FIG. 1.
Figure 3:
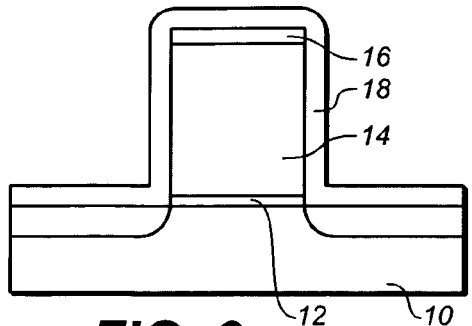
Figure 4:
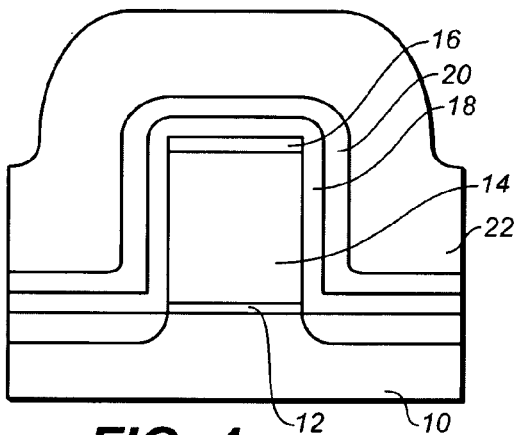
Figure 5:
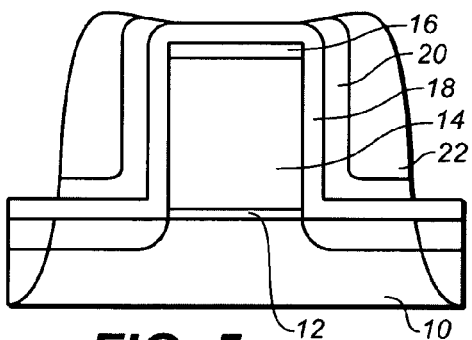
Figure 6:
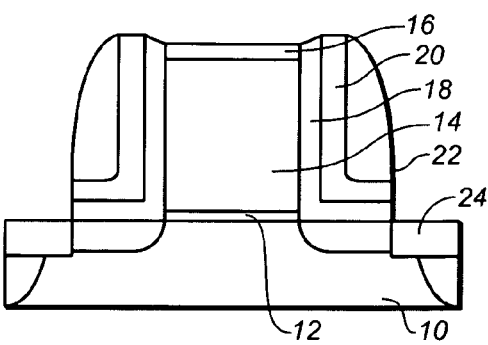
Figure 7:
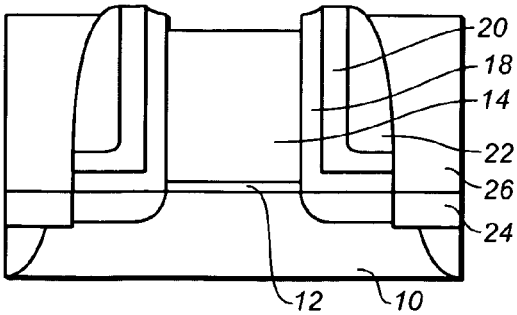
Figure 8:
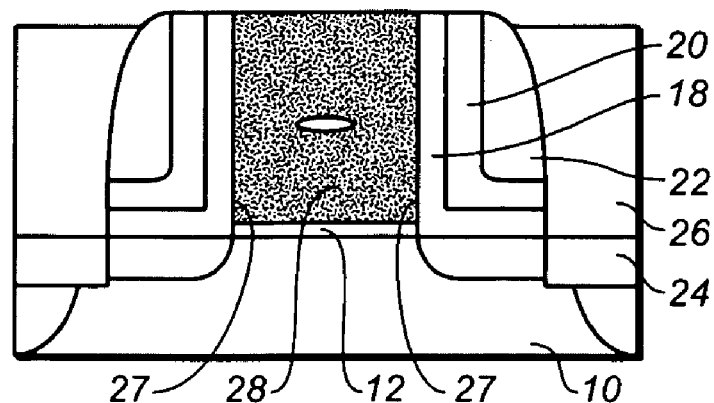
Figure 9:
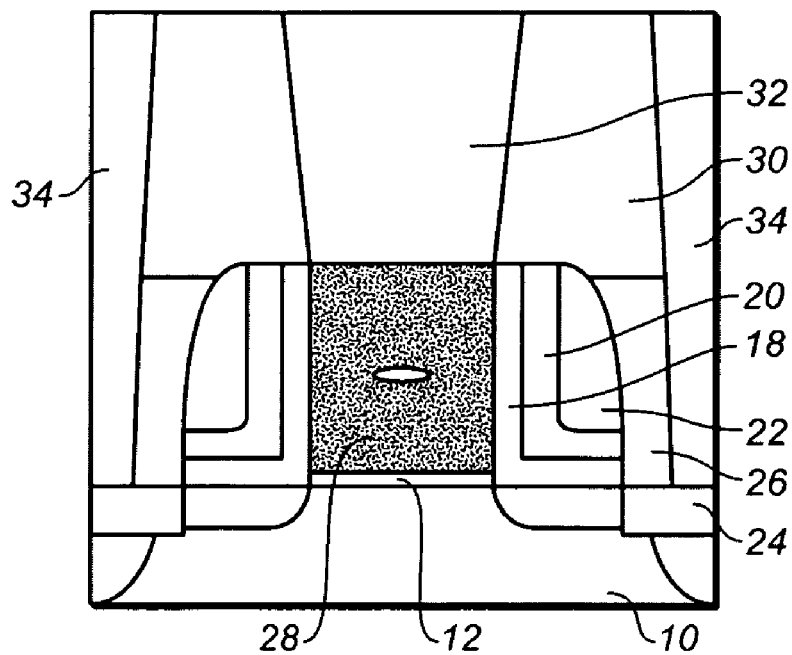

The major steps of the gate scheme which is in accordance with an embodiment of the present invention, and at what point the gate edge liner is deposited, are detailed in FIG. 1 (and FIGS. 2 to 9). The steps are as follows: gate oxide growth and poly-Si deposition (transistor can have STI); poly-Si patterning with hard mask, resist ashing and stripping, cleaning (after which the device looks as shown in FIG. 2, wherein reference numeral 10 identifies the silicon substrate, reference numeral 12 identifies the $SiO_2$ gate oxide, reference numeral 14 identifies the poly-Si, and reference numeral 16 identifies the mask); LDD masking, implanting, resist ashing and stripping, cleaning (no poly-reoxidation, surface $SiO_2$ is completely removed); thin gate edge liner deposition (e.g., 50 Å to 200 Å, wherein the spacer liner is in direct contact with the Silicon (after which the device looks as shown in FIG. 3, wherein reference numeral 18 identifies the gate edge liner); thin spacer LTO liner deposition (e.g., 100 Å ), which reduces any stress issues associated with a thick SiN spacer; major spacer SiN liner deposition (after which the device looks as shown in FIG. 4, wherein reference numeral 20 identifies the LTO liner and reference numeral 22 identifies the SiN spacer); spacer etch, LTO etch back; SD implanting, annealing (after which the device looks as shown in FIG. 5); silicide deposition, RTA1, selective etch, RTA2 (after which the device looks as shown in FIG. 6, wherein reference numeral 24 identifies the silicide); ILD deposition, CMP (chemical mechanical polishing), residual hard mask removal (after which the device looks as shown in FIG. 7, wherein reference numeral 26 identifies the ILD); etching of poly-Si; wet etching of dummy gate dielectric; gate oxide growth (e.g. thermal oxidation, plasma oxidation, high K deposition); metal fill, CMP (chemical mechanical polishing) (after which the device looks as shown in FIG. 8 with no undercutting under the spacer nitride (i.e., at 27), wherein reference numeral 28 identifies the metal); ILD, CMP, contact mask, contact holes (after which the device looks as shown in FIG. 9, wherein reference numeral 30 identifies ILD, reference numeral 32 identifies metal, and reference numeral 34 identifies contact holes); metal fill; perform the rest of the backend process.

So, in the process, the thin gate edge liner 18 (e.g., 50 Å to 200 Å) is deposited before the spacer material 20, 22. It is critical to ensure that there is no $SiO_2$ on the surface of the SD areas prior to the gate edge liner deposition, in order to avoid any undercut issues in the spacer region. FIG. 8 illustrates how the liner covers the dummy gate and $SiO_2$-free SD areas of the transistor.

Of note in this flow is that a residual amount of hard mask material is left on the dummy gate in order to selectively silicide only the source drain areas This residual mask, which may consist of materials such as $SiO_2$ or SiON, prevents the formation of metal silicide on the poly-Si dummy electrodes during the formation of silicide contacts in the SD areas at a later stage (see FIG. 6), so that the removal of the dummy gate using dry or wet etching processes can be carried out.

The process ensures that there is no $SiO_2$ on the surface of the SD areas before the spacer module. Instead of depositing LTO liner film for the spacer, a thin (e.g. 50 Å to 200 Å ) film of materials chemically inert to the dummy gate and sacrificial $SiO_2$ wet etching chemicals is deposited before LTO, and subsequently the main SiN film. In addition to being inert, this liner film should also introduce negligible stress to the Si substrate and electrically insulating. It can either take the form of a homogeneous film or a film with graded structural characteristics. Due to the chemically inert nature of the liner film to the wet etching chemicals, there will be no undercutting of the spacer during dummy gate dielectric removal which effectively mitigates the gate length change problems as well as non-uniform gate dielectrics issues present in the existing replacement gate scheme.

The present invention has a variety of advantages with respect to both technical and technical aspects. These include, but are not limited to, the following:

1) Critical gate lengths are better defined and controlled from device to device, which will result in improved process robustness.
2) Prevention of spacer undercut during dummy gate stack removal.
3) Well-defined gate stack edge.
4) Due to the chemically inert nature of the liner materials, chemical reactions between the liner and metal gate electrodes will be minimized, which subsequently will result in a better control of gate properties.
5) Long life span: It is anticipated that the present invention will solve the gate electrode problems for CMOS transistors of 65 nm, 45 nm and 25 nm technology nodes and will have a life time of at least 9 years, taking one technology generation as 3 years.
6) Low development and manufacturing costs.

Preferably, a method in accordance with an embodiment of the present invention has the following features:

(1) The retaining of residual hard mask after poly-Si dummy gate etching and subsequent ashing, resist stripping and cleaning.
(2) The deposition of a chemically inert liner film before the deposition of LTO and SiN spacer films.
(3) The removal of the residual hard mask after silicide formation, ILD deposition and CMP but before the wet etching of poly-Si While embodiments of the present invention are shown and described, it is envisioned that those skilled in the art may devise various modifications of the present invention without departing from the spirit and scope of the appended claims.

What is claimed is:

1. A semiconductor structure comprising: a silicon substrate; a gate oxide on the silicon substrate; metal on the gate oxide; a gate edge liner on sides of the metal and gate oxide and on the silicon substrate, wherein the gate edge liner defines sidewalls, the gate oxide contacts a portion of the sidewalls and the metal contacts a remaining portion of the sidewalls; a dielectric in contact with the gate edge liner and providing walls, wherein the metal contacts the walls which are provided by the dielectric and fills space therebetween; silicide in contact with the silicon substrate; and a contact hole in contact with the silicide and the dielectric.

2. A semiconductor structure as recited in claim 1, wherein said gate edge liner contains Hafnia.

3. A semiconductor structure as recited in claim 1, wherein said gate edge liner is at least one of a carbide, a nitride and a ceramic.

4. A semiconductor structure as recited in claim 1, further comprising a spacer liner on the gate edge liner.

5. A semiconductor structure as recited in claim 1, further comprising a first spacer liner on the gate edge liner, and a second spacer liner on the first spacer liner.

6. A. semiconductor structure as recited in claim 5, wherein said second spacer liner is thicker than said first spacer liner.

7. A semiconductor structure as recited in claim 1, wherein there is no undercut in the gate edge liner wherein metal is disposed.

8. A semiconductor gate structure comprising: a silicon substrate; a gate oxide on the silicon substrate; metal on the gate oxide; a gate edge liner on sides of the metal and gate oxide and on the silicon substrate, wherein the gate edge liner defines sidewalls, the gate oxide contacts a portion of the sidewalls and the metal contacts a remaining portion of the sidewalls, and a dielectric in contact with the gate edge liner and providing walls, wherein the metal contacts the walls which are provided by the dielectric and fills space therebetween, wherein said gate edge liner is at least one of a Hafnia-containing material, a carbide, a nitride, and a ceramic.

9. A semiconductor gate structure as recited in claim 8, further comprising a spacer liner on the gate edge liner.

10. A semiconductor gate structure as recited in claim 8, further comprising a first spacer liner on the gate edge liner, and a second spacer liner on the first spacer liner.

11. A semiconductor gate structure as recited in claim 10, wherein said second spacer liner is thicker than said first spacer liner.

12. A semiconductor gate structure as recited in claim 8, wherein there is no undercut in the gate edge liner wherein metal is disposed.

13. A semiconductor gate structure comprising: a silicon substrate; a gate oxide on the silicon substrate; metal on the gate oxide; a gate edge liner on sides of the metal and gate oxide and on the silicon substrate, wherein the gate edge liner defines sidewalls, the gate oxide contacts a portion of the sidewalls and the metal contacts a remaining portion of the sidewalls, and a dielectric in contact with the gate edge liner and providing walls, wherein the metal contacts the walls which are provided by the dielectric and fills space therebetween, wherein there is no undercut in the gate edge liner wherein metal is disposed.

14. A semiconductor gate structure as recited in claim 13, further comprising a spacer liner on the gate edge liner.

15. A semiconductor gate structure as recited in claim 13, further comprising a first spacer liner on the gate edge liner, and a second spacer liner on the first spacer liner.

16. A semiconductor gate structure as recited in claim 15, wherein said second spacer liner is thicker than said first spacer liner.

* * * * *